US007615397B2

(12) United States Patent
Lee et al.

(10) Patent No.: US 7,615,397 B2
(45) Date of Patent: Nov. 10, 2009

(54) MICRO-ELEMENT PACKAGE AND MANUFACTURING METHOD THEREOF

(75) Inventors: Seung Wan Lee, Suwon-si (KR); Woon Bae Kim, Suwon-si (KR); Kyu Dong Jung, Suwon-si (KR); Min Seog Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 465 days.

(21) Appl. No.: 11/584,486

(22) Filed: Oct. 23, 2006

(65) Prior Publication Data

US 2007/0210399 A1    Sep. 13, 2007

(30) Foreign Application Priority Data

Mar. 8, 2006    (KR) .................. 10-2006-0021670

(51) Int. Cl.
*H01L 21/00*    (2006.01)
(52) U.S. Cl. .................. 438/64; 438/460; 438/118; 257/E23.193
(58) Field of Classification Search .................. 438/64, 438/460, 118
See application file for complete search history.

(56) References Cited

U.S. PATENT DOCUMENTS

2007/0216028 A1* 9/2007 Lee et al. .................. 257/738
2007/0228403 A1* 10/2007 Choi et al. .................. 257/98

FOREIGN PATENT DOCUMENTS

| JP | 63-122167 A | 5/1988 |
|---|---|---|
| JP | 3-151666 A | 6/1991 |
| JP | 2002-231918 A | 8/2002 |
| KR | 10-2001-0055249 A | 7/2001 |
| KR | 10-2003-0091389 A | 12/2003 |
| KR | 10-2005-0024264 A | 3/2005 |
| KR | 10-2005-0093752 A | 9/2005 |

* cited by examiner

*Primary Examiner*—Jack Chen
(74) *Attorney, Agent, or Firm*—Sughrue Mion, PLLC (57) ABSTRACT

A method of manufacturing a micro-element package which can reduce a manufacturing cost and improve productivity by simplifying its structure and manufacturing process, and also can make contributions to miniaturization and thinness, and the micro-element package are provided. The method of the micro-element package including: providing a substrate having a micro-element on its top surface and a transparent cover having a groove on its bottom surface; attaching the transparent cover on the substrate, wherein the bottom surface of the transparent cover where the groove is formed faces the micro-element; exposing the groove by selectively eliminating the transparent cover; and dicing the substrate along the exposed groove.

23 Claims, 8 Drawing Sheets

FIG. 12 a micro-element package according to an exemplary embodiment of the present invention;
MICRO-ELEMENT PACKAGE AND MANUFACTURING METHOD THEREOF

CROSS-REFERENCE TO RELATED APPLICATION

This application claims priority from Korean Patent Application No. 10-2006-0021670, filed on Mar. 8, 2006, in the Korean Intellectual Property Office, the disclosure of which is incorporated herein by reference.

BACKGROUND OF THE INVENTION

1. Field of the Invention

Apparatuses and methods consistent with the present invention relate to a micro-element package and a method of manufacturing the micro-element package, and more particularly, to a micro-element package which can reduce manufacturing costs, can be advantageous for mass production due to simplifying its structure and manufacturing process, and also can facilitate miniaturization and promote thinness, and a method of manufacturing the micro-element package.

2. Description of Related Art

An image sensor is a device which changes light into an electrical signal, and is utilized in various fields of our daily lives.

The image sensor includes a light receiving portion which generates charges in accordance with received light, and a circuit portion which converts the charges into a voltage and processes the converted voltage into a final form. According to a driving method, the image sensor may be divided into a charge coupled device (CCD) image sensor and a complementary metal oxide semiconductor (CMOS) image sensor.

Due to an electronics package technology, the image sensor is manufactured as an image sensor module in an image sensor chip and installed in various types of products.

In this instance, a CMOS image sensor module is manufactured by utilizing a Chip On Board (COB) method, a Chip On Film (COF), etc., so that the size and height of the CMOS image sensor module may be reduced according to a recent tendency of light, thin, and a miniaturized image sensor modules.

Figure 1:
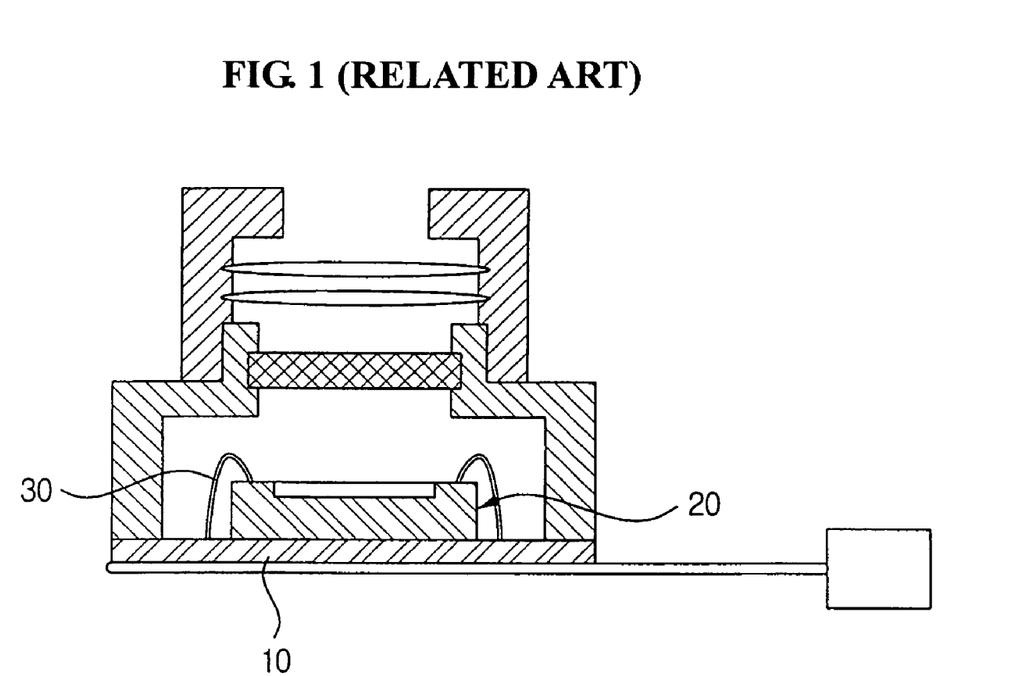
FIG. 1 is a cross-sectional view illustrating a configuration of an image sensor module according to a related art.

FIG. 1 is a cross-sectional diagram illustrating a structure of an image sensor module according to a related art.

As shown in FIG. 1, the COB method is a method of attaching a printed circuit board (PCB) 10 on a rear surface of the image sensor chip 20 by using a die bonding agent and connecting an electrode of the PCB 10 and an input/output (I/O) terminal of the image sensor chip 20, which can be advantageous for mass production by utilizing a similar process to an existing semiconductor production line.

However, the method as described above may not be able to reduce the height of the image sensor module more than a certain value. Also, the method may not be utilized for a device which is manufactured to be thin and in a small size.

Also, the image sensor module according to the above-described method must be individually packaged in a chip unit. Accordingly, productivity may be deteriorated and manufacturing costs may be increased. Also, in the case of the image sensor module constructed as above, a yield may be deteriorated due to contamination by particles during a manufacturing process.

SUMMARY OF THE INVENTION

The present invention provides a micro-element package which can reduce manufacturing costs and can be advantageous for mass production due to simplifying its structure and manufacturing process, and a method of manufacturing the micro-element package.

The present invention also provides a micro-element package which can be easily and quickly manufactured to be advantageous in mass production and also can prevent a yield from decreasing due to contamination by particles and the like, and a method of manufacturing the micro-element package.

The present invention also provides a micro-element package which can be manufactured thin and in a small size, and a method of manufacturing the micro-element package.

According to an aspect of the present invention, there is provided a method of micro-element package including: providing a substrate having a micro-element formed on a top surface of the substrate and a transparent cover having a groove formed on a bottom surface of the substrate; attaching the transparent cover on the substrate, wherein the bottom surface of the transparent cover where the groove is formed faces the micro-element; exposing the groove by selectively eliminating a portion of the transparent cover; and dicing the substrate along the exposed groove.

The substrate may be made of various types of materials and formed in various sizes and a metal pad may be formed on the top surface of the substrate, so that the substrate is electrically connected to the micro-element. The metal pad may be additionally formed during a process of the micro-element and may be placed directly below the groove.

In this instance, the micro-element may be any one of a micromechanical engineering element, a microelectronics element, and an opto-electronics element. As an example, an image sensor adopted in a camera module as the micromechanical engineering element may be utilized for the micro-element.

The transparent cover may be made of a transparent or a translucent material and be made of glass or plastics. Depending upon embodiments, a functional coating layer may be formed on a surface of the transparent cover for a specific condition, for example, a filtering layer for selectively passing a desired wavelength of light may be formed on it.

The transparent cover attached to the substrate is placed above the micro-element to be apart from the micro-element and forms a sealed air cavity on the top surface of the micro-element, which is able to be accomplished by interposing a sealing pattern between the substrate and the transparent cover. The sealing pattern is formed on at least one surface of facing surfaces between the substrate to be attached to the at least one surface, and the sealing pattern may be made of epoxy resin.

In exposing the groove, the groove may be exposed by thinning the entire top surface of the transparent cover, and depending upon circumstances, exposed by selectively eliminating a portion of the transparent cover directly above the groove.

Also, a solder ball or a metal bump may be formed on a surface of the metal pad before dicing the substrate. In this case, the solder ball or the metal bump may be formed before thinning the transparent cover, and depending upon circumstances, may be formed after thinning the transparent cover. The substrate may be formed to be thinner through the thinning process.

BRIEF DESCRIPTION OF THE DRAWINGS

The above and/or other aspects of the present invention will become apparent and more readily appreciated from the following detailed description, taken in conjunction with the accompanying drawings, in which.

DETAILED DESCRIPTION OF EXEMPLARY EMBODIMENTS

Reference will now be made in detail to embodiments of the present invention, examples of which are illustrated in the accompanying drawings, wherein like reference numerals refer to the like elements throughout. The exemplary embodiments are described below in order to explain the present invention by referring to the figures.

Figure 2:
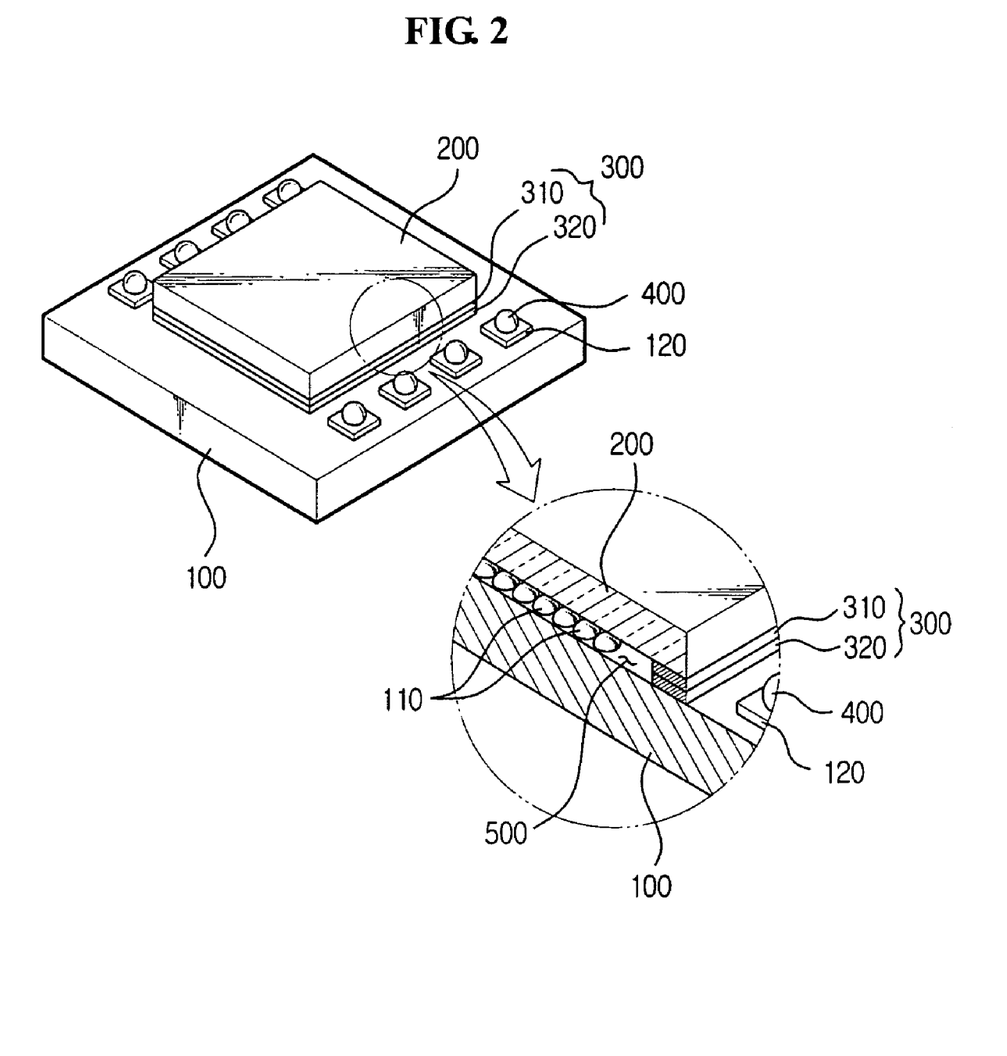
FIG. 2 is a perspective view illustrating a configuration of a micro-element package according to an exemplary embodiment of the present invention.
Figure 3:
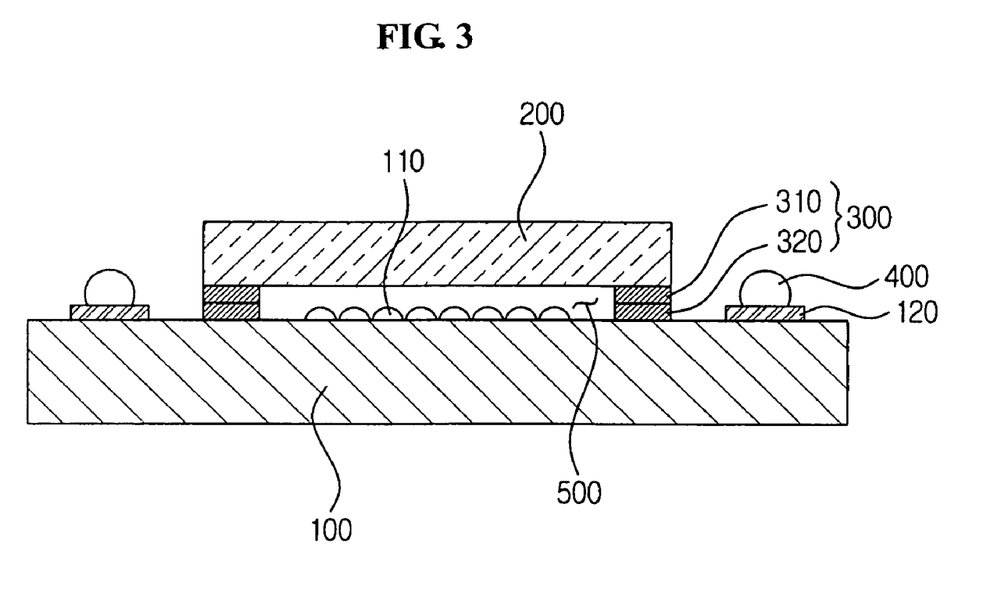
FIG. 3 is a cross-sectional view illustrating a configuration of a micro-element package according to an exemplary embodiment of the present invention.

FIG. 2 is a perspective view illustrating a configuration of a micro-element package according to an exemplary embodiment of the present invention and FIG. 3 is a cross-sectional view illustrating a configuration of a micro-element package according to the present invention.

As illustrated in FIG. 2 and FIG. 3, a micro-element package 110 according to an exemplary embodiment of the present invention includes a substrate 100 having a micro-element 110 and a metal pad 120 formed in a periphery of the micro-element 110 to be electrically connected to the micro-element 110, and a transparent cover 200 attached on the substrate 100 to receive the micro-element 110 and expose the metal pad 120.

The substrate 100 is provided by a wafer made of silicon, in which case the wafers may be provided in various sizes, such as four inches, six inches, eight inches, ten inches, and the like. In the current exemplary embodiment, an example that the substrate 100 is provided by the wafer made of silicon is taken, but depending upon circumstances, the substrate 100 may be provided by a wafer made of lithium-niobate (LiNbO3), lithium tantalite (LiTaO3), quartz, and the like.

A micromechanical engineering element, such as an image sensor, or a microelectronics element and an opto-electronics element may be utilized for the micro-element 110. Hereinafter, an example of utilizing the image sensor which is the micromechanical element for the micro-element 110 will be described.

The micro-element 110 is provided with a plurality of micro-elements and spaced apart by a predetermined distance on a surface of the substrate 100.

The micro-element 110 is formed on the substrate 110. The metal pad 120 is formed in a certain pattern in a periphery of each of the micro-elements 110 to be electrically connected to each of the micro-elements 110.

In this instance, the utilized transparent cover 200 is made of a transparent or translucent material, such as a transparent glass. Depending upon circumstances, a functional coating film, such as an antireflection coating film and an infrared ray-proof coating film and the like, may be formed on the surface of the transparent cover 200.

Also, the transparent cover 200 is formed in a smaller size than the substrate 100 to expose the metal pad 120 toward the top surface of the substrate 100.

The transparent cover 200 is placed above the micro-element 110 of the substrate 100 to be separated from the micro-element 110, and an air cavity 500 is provided between the transparent cover 200 and the micro-element 110.

In this case, the sealed air cavity 500 may be formed by a spacer 300 interposed between the substrate 100 and the transparent cover 200.

The spacer 300 includes a first sealing pattern 310 and a second sealing pattern 320. The first sealing pattern 310 is formed on a bottom surface of the transparent cover 200, and conversely, the second sealing pattern 320 is formed on the top surface of the substrate 100. In this case, the first sealing 310 and the second sealing pattern 320 are sealed by a thermal pressing and the like. Also, the sealing patterns 310 and 320 are made of epoxy resin.

The sealed air cavity 500 may be formed by the spacer 300 interposed between the substrate 100 and the transparent cover 200.

The spacer 300 includes the first sealing pattern 310 formed on the top surface of the substrate and the second sealing pattern 320 formed on a bottom surface of the transparent cover. The first sealing pattern 310 and the second sealing pattern 320 are sealed by a thermal pressing and the like and are made of epoxy resin.

In the above exemplary embodiment, the spacer 300 is formed by the first sealing pattern 310 and the second sealing pattern 320, however, depending upon circumstances, only one sealing pattern may be formed on either side of the substrate 100 or the transparent cover 200, and subsequently, the spacer 300 may be formed.

Also, a general solder ball 400 or a metal bump is provided on the top surface of the metal pad 120.

Due to the configuration above described, the thinning process for the substrate and the transparent cover may be possible, the micro-element package may be thinner, a height of an entire image sensor module may be reduced by placing the micro-element package on either a flexible printed circuit board (PCB) or a PCB on a top surface of the image sensor package, and consequently a lighter, thinner, and miniaturized image sensor module may be provided.

Also, since the top surface of the micro-element 110 is protected by the transparent cover 200, so that contamination by dust may be prevented, and since the air cavity 500 is provided between the transparent cover 200 and the micro-element 110, and, conversely to a conventional configuration filled with a transparent material, effectiveness of concentrating light is enhanced, so that the present invention may be applied to an image sensor module with a high resolution.

Below, a method of manufacturing a micro-element package having the same configuration will be described.

FIG. 4 through FIG. 10 are cross-sectional views illustrating operations of methods of manufacturing a micro-element package according to an exemplary embodiment of the present invention.

The micro-element package according to an exemplary embodiment of the present invention may be manufactured in a wafer level package process including: providing a substrate 100 having a micro-element 110 on its top surface and a transparent cover 200 having a groove 210 on its bottom surface; attaching the transparent cover 200 on the substrate 100, wherein the bottom surface of the transparent cover 200 where the groove 210 is formed faces the micro-element 110; exposing the groove 210 by selectively eliminating the transparent cover 200; and dicing the substrate 100 along the exposed groove 210.

Figure 4:
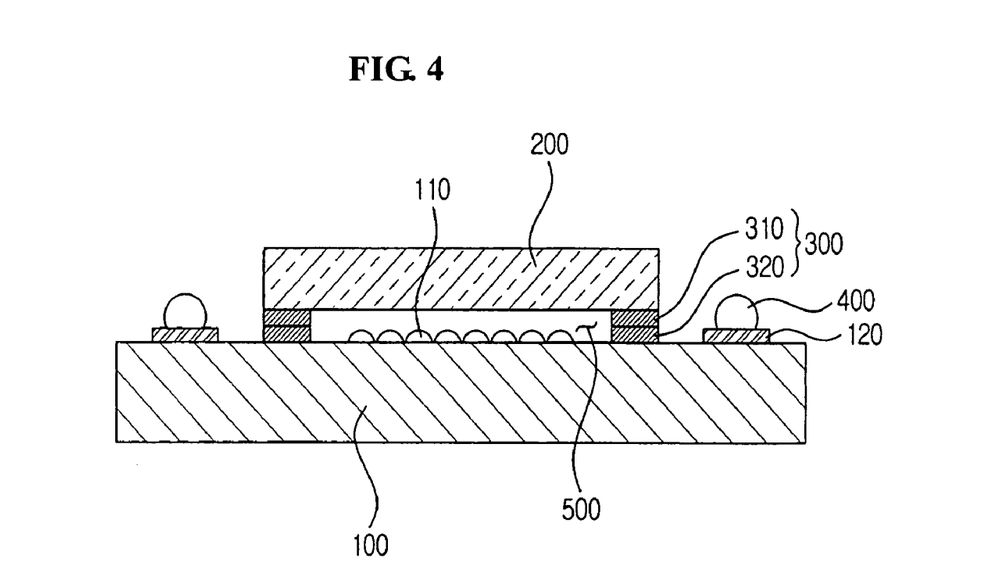
FIG. 4 through FIG. 10 are cross-sectional views illustrating operations of methods of manufacturing a micro-element package according to exemplary embodiments of the present invention.

Initially, as illustrated in FIG. 4, the substrate 100 having a micro-element 110 on its top surface is provided.

The substrate 100 is a wafer made of silicon, and the wafer may be provided in various sizes, such as four inches, six inches, eight inches, ten inches and the like. In the current exemplary embodiment, an example that the substrate 100 is provided by the wafer made of silicon is taken, but depending upon circumstances, the substrate 100 may be provided by a wafer made of lithium-niobate (LiNbO3), lithium tantalite (LiTaO3), quartz and the like.

The substrate 100 is provided with a plurality of the micro-elements 110 and a metal pad 120 is formed on the substrate 100 to be electrically connected to the plurality of micro-elements 110 on the substrate 100 to be placed below the plurality of grooves 210.

The metal pad 120 may be additionally formed on the substrate 100 during the forming process of the plurality of the micro-elements 110 and placed below the groove 210.

The plurality of the micro-elements 110 may be any one of a micromechanical engineering element, a microelectronics element, and an opto-electronics element, for an example, and an image sensor may be utilized for the micro-element 110.

Figure 5:
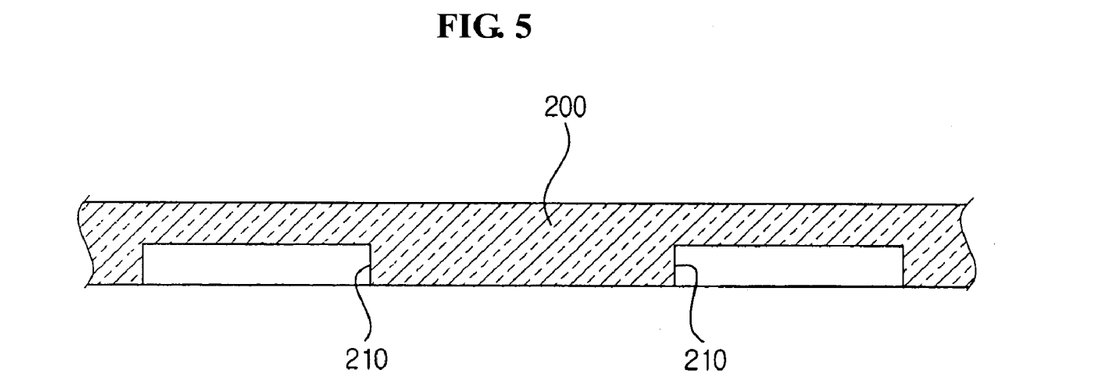

Either during or after providing the substrate 100 illustrated in the FIG. 5, the transparent cover 200 having a groove 210 on its bottom surface is provided.

The transparent cover 200 may be made of a transparent or a translucent material. For example, a general transparent glass having the same size and shape as the substrate 100 may be utilized.

The transparent cover 200 having a plurality of grooves 210 on its bottom surface is provided and the plurality of grooves 210 are formed between the plurality of micro-elements 110. The plurality of grooves 210 are respectively formed along a periphery of each of the micro-elements 110, and the plurality of grooves 210 may be formed through a method of a process, for example, an etching or a machine processing. In the current exemplary embodiment, an example that the plurality of grooves 210 is formed to have a square-shaped cross-section is taken, but depending upon circumstances, may be formed to have various shapes of a cross-section, for example, a round shape cross-section or the like.

The transparent cover 200 may be attached to the substrate 100, and in this instance, a bottom surface of the transparent cover 200 where the formed groove 210 is facing the plurality of micro-element 110, is described below.

The transparent cover 200 attached on the substrate 100 is spaced apart from the micro-element 110 by a predetermined distance and forms a sealed air cavity 500 on a top surface of the micro-element 110, which is accomplished by interposing a sealing pattern between the substrate 100 and the transparent cover 500.

Namely, the attaching the transparent cover 200 to the substrate 100 may be accomplished by forming a sealing pattern on at least one of the facing surfaces of them 100 and 200 and hermetically bonding them by using the sealing pattern.

Below, in the forming sealing pattern, the sealing patterns 310 and 320 which are respectively formed on each of the facing surfaces of the transparent cover 200 and the substrate 100 will be taken as an example and illustrated.

Figure 6:
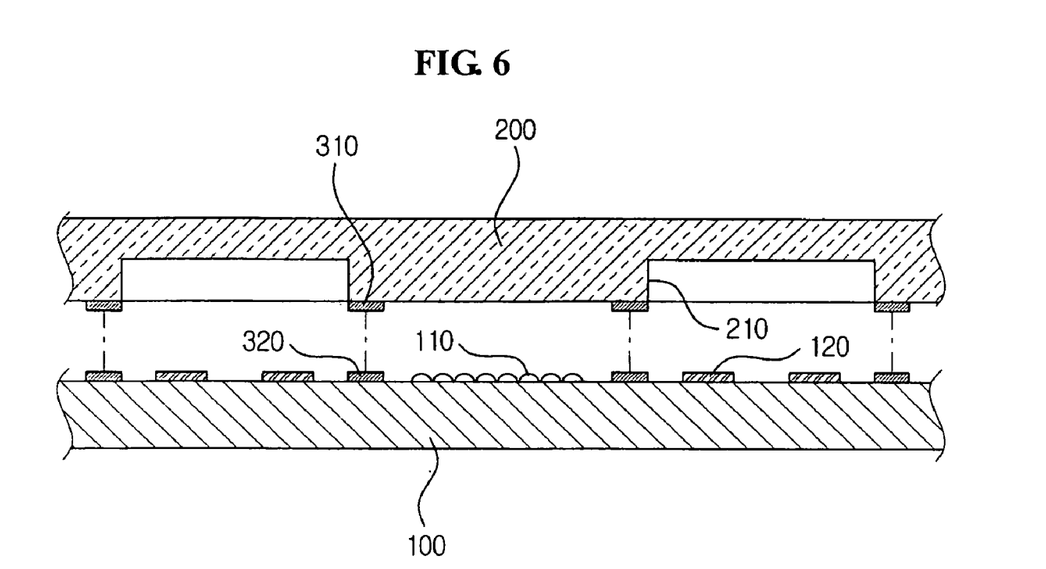

As illustrate in FIG. 6, either during or after the forming the first sealing pattern 310 on the bottom surface of the transparent cover 200, the second sealing pattern 320, corresponding to the first sealing pattern 310, is formed on a top surface of the substrate 100.

The first sealing pattern 310 and the second sealing pattern 320 are made of epoxy resin and are formed to be placed between the plurality of grooves 210 and the micro-element 110.

Figure 7:
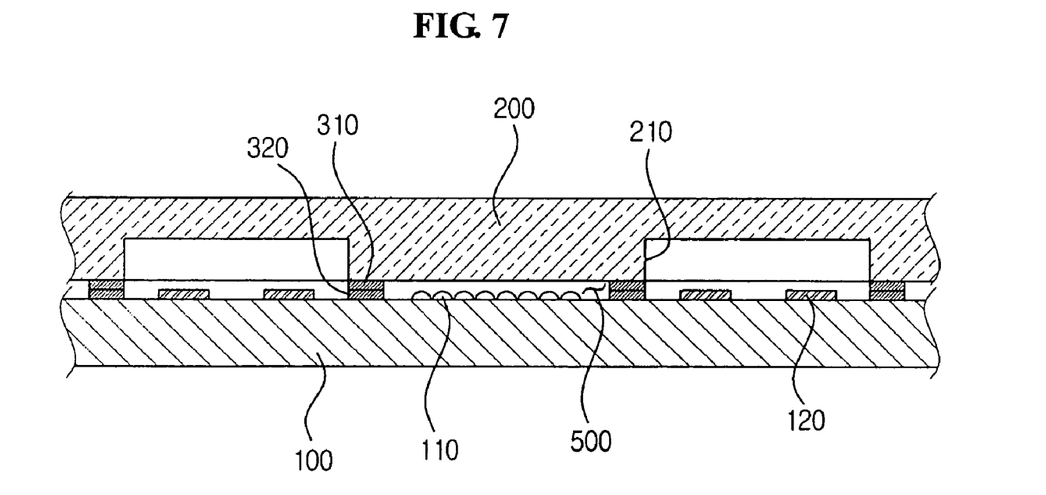

As illustrated in FIG. 7, the sealed air cavity 500 may be formed between the top surface of the substrate 100 and the transparent cover 200 by sealing the first sealing pattern 310 and the second sealing pattern 320 facing each other. In this case, each of the first sealing pattern 310 and the second sealing pattern 320 are sealed by a thermal pressing and the like.

The above sealing patterns 310 and 320 may bond the substrate 100 and the transparent cover 200, and also may form the sealed air cavity 500, so that the sealing patterns 310 and 320 are required to have a strong sealing property and bonding property. Accordingly, during the sealing process, sealing surfaces between the first sealing pattern 310 and the second sealing pattern 320 are sealed together without a gap therebetween, and moreover, adhesive strength between the sealing faces is to be even.

Figure 8:
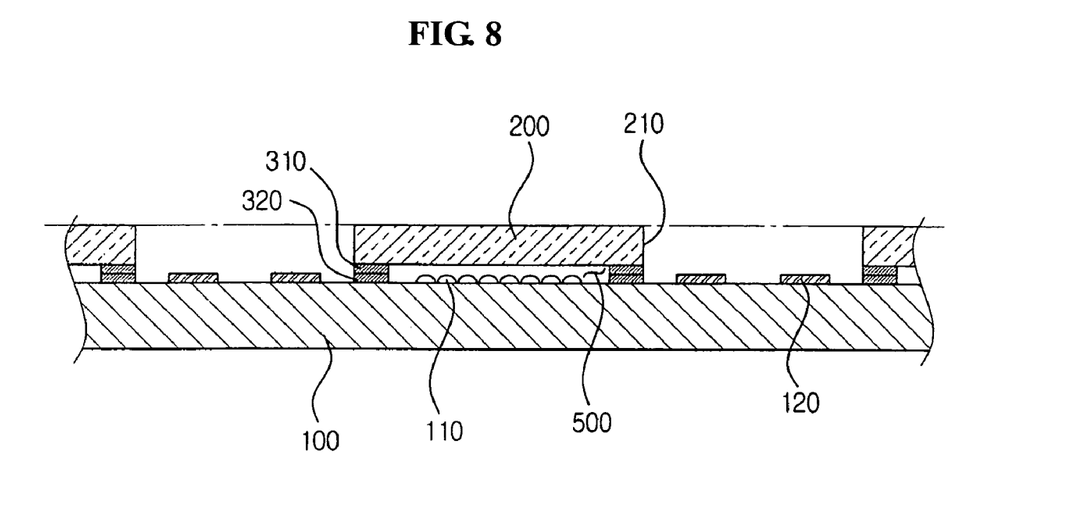

Below, as illustrated in FIG. 8, the groove 210 is exposed by selectively eliminating the transparent cover 200.

In the exposing the groove 210, the groove 210 may be exposed by thinning an entire top surface of the transparent cover 200, by a method of lapping and grinding. Depending upon circumstances, the groove 210 may be exposed by selectively eliminating a portion of the transparent cover 200 directly above the groove.

In the exposing the groove 210, the transparent cover 200 is partially eliminated, immediately after the groove 210 is exposed, the transparent cover 200 may only remain directly above each of the micro-elements 110 and a thickness of the transparent cover 200 may be formed thinner. In this instance, the metal pad 120 is exposed as well.

Depending upon circumstances, after thinning the top surface of the transparent cover 200, a functional coating film, such as an antireflection coating film and an infrared ray-proof coating film and the like, may be formed on the surface of the transparent cover 200.

Figure 9:
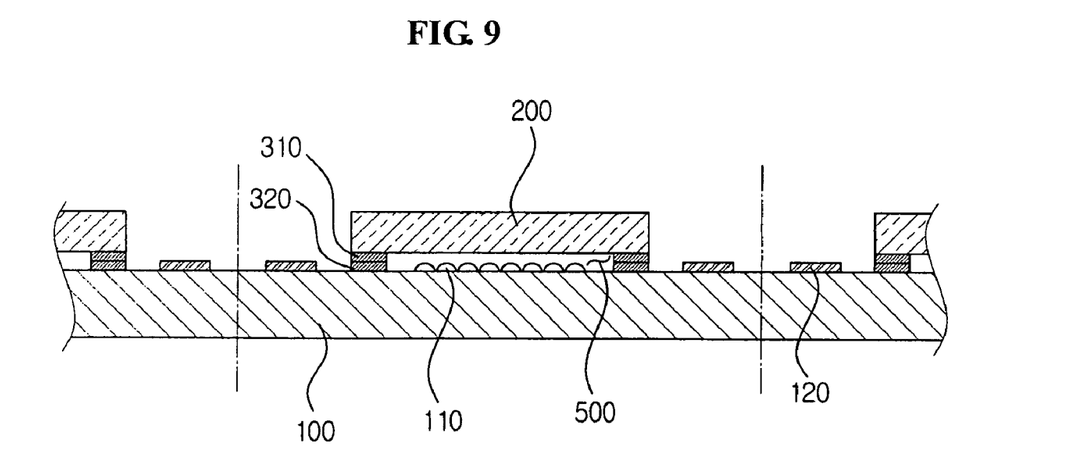

Below, as illustrated in FIG. 9, the substrate 100 is diced along the groove 210.

Figure 10:
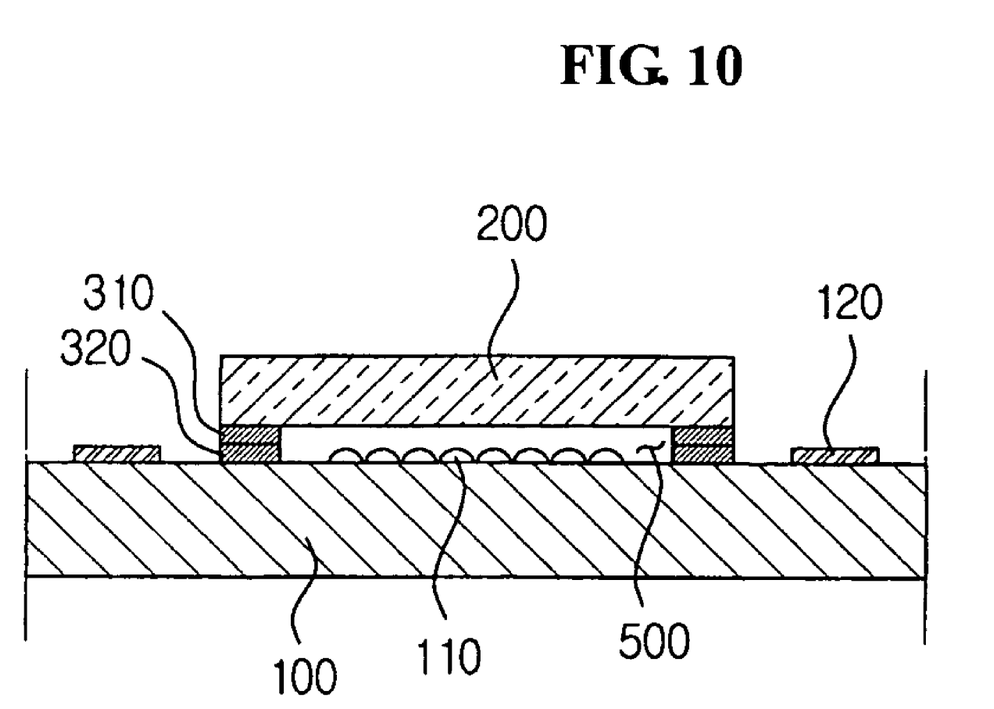

Dicing of the substrate 100 may be accomplished by general dicing equipment, and finally the substrate 100 may be divided into an individual micro-element package containing the micro-element 110. The individual micro-element package is illustrated in FIG. 10.

Figure 11:
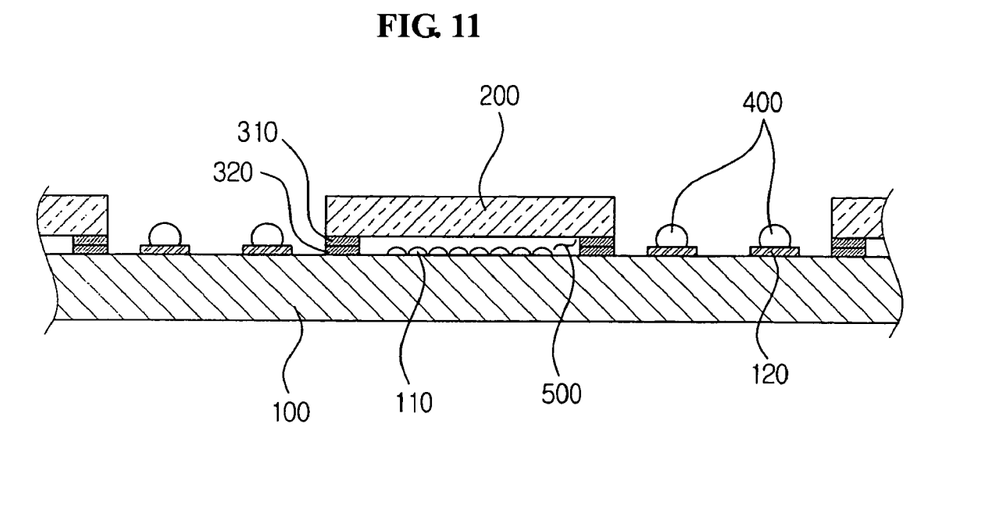
FIG. 11 through FIG. 12 are a cross-sectional views respectively illustrating a method of manufacturing a micro-element package according to another exemplary embodiment of the present invention.
Figure 12:
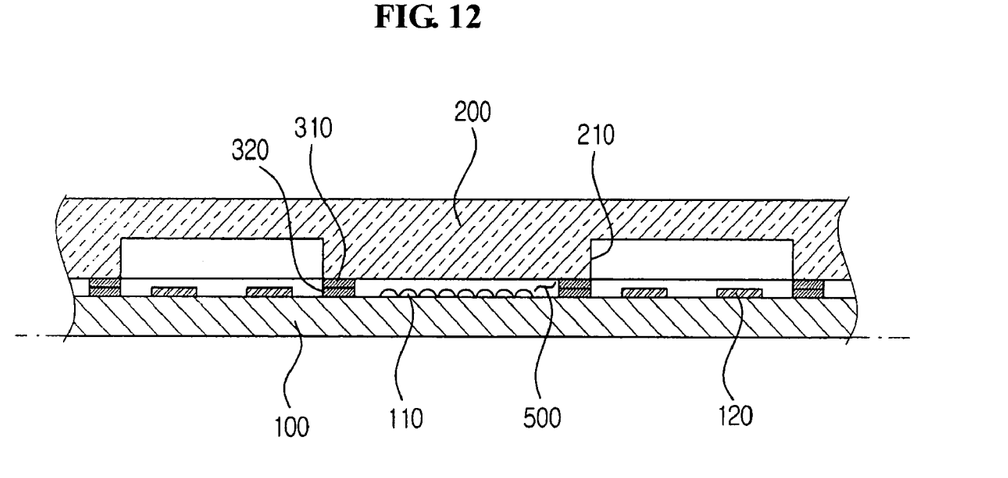

FIG. 11 through FIG. 12 is a cross-sectional view respectively illustrating a method of manufacturing a micro-element package according to another exemplary embodiment of the present invention.

Identical or similar descriptions regarding a configuration with respect to the above described configuration will be omitted.

As a method of manufacturing a micro-element package according to another exemplary embodiment of the present invention, as illustrated in FIG. 11, a solder ball 400 or a metal bump may be formed on a top surface of the metal pad 120 before dicing of the substrate 100.

The solder ball 400 or the metal bump may be formed before thinning the transparent cover 200, according to circumstances, may be formed after thinning the transparent cover 200.

As a method of manufacturing a micro-element package according to a still another exemplary embodiment of the present invention, as illustrated in FIG. 12, a bottom surface of the substrate 100 may be thinned by a method of lapping or grinding.

A thickness of the substrate 100 may be thinned by thinning the bottom surface of the substrate 100. In the current exemplary embodiment of the present invention, the thinning process for the substrate 100 is implemented before thinning the transparent cover 200, however the present invention is not limited to the described embodiments.

With respect to the each micro-element package having the solder ball 400 or the metal bump and divided by the dicing process, the solder ball 400 or the metal bump may be electrically connected to either a flexible PCB or a PCB by a reflow process or a method of ultrasonic bonding.

Depending upon circumstances, each micro-element package may be electrically connected to the flexible PCB or the PCB by a conductive film, such as an anisotropic conductive film (ACF), a conductive paste, such as an anisotropic paste (ACP), without the solder ball 400 or the metal bump.

As described above, according to an exemplary embodiment of the present invention, the micro-element package and the method of manufacturing the micro-element package can be advantageous for mass production by simplifying its structure and manufacturing process, and also can facilitate miniaturization and promote thinness, and a method of manufacturing the micro-element package.

Also, according to an exemplary embodiment of the present invention, the micro-element package can be manufactured by a wafer level package process, so that mass production is possible, and manufacturing costs can be reduced.

Also, in the case of the image sensor module constructed as above, a yield may be deteriorated due to contamination by particles during a manufacturing process.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A method of manufacturing a micro-element package, the method comprising:
    providing a substrate comprising a micro-element on a top surface of the substrate and a transparent cover having a groove on a bottom surface of the transparent cover;
    attaching the transparent cover on the substrate, wherein the bottom surface of the transparent cover where the groove is formed faces the micro-element;
    exposing the groove by selectively eliminating a portion of the transparent cover; and
    dicing the substrate along the exposed groove.

2. The method of claim 1, wherein, in the attaching the transparent cover on the substrate, the transparent cover is placed above the micro-element to be separated from the micro-element, and an air cavity is provided between the transparent cover and the micro-element.

3. The method of claim 1, comprising forming an electrode electrically connected to the micro-element on the substrate to be placed below the groove.

4. The method of claim 3, wherein the electrode comprises a metal pad.

5. The method of claim 3, further comprising forming a solder ball or a metal bump on a surface of the electrode before the dicing the substrate.

6. The method of claim 1, wherein the groove is formed to surround the micro-element.

7. The method of claim 1, wherein the exposing the groove is accomplished by a thinning process.

8. The method of claim 1, wherein the exposing the groove is accomplished by selectively eliminating a portion of the transparent cover directly above the groove.

9. The method of claim 1, wherein the substrate comprises a wafer made of at least one of silicon, lithium-niobate (LiNbO3), lithium tantalite (LiTaO3), and quartz.

10. The method of claim 1, wherein the micro-element comprises at least one of a micromechanical engineering element, a microelectronic element, and an opto-electronic element.

11. The method of claim 1, wherein the transparent cover comprises at least one of glass and plastic, the glass or plastic being transparent or translucent.

12. The method of claim 1, wherein the transparent cover comprises a functional coating layer.

13. The method of claim 12, wherein the functional coating layer comprises at least one of an antireflection coating film, an infrared ray-proof coating film and a filtering layer for selectively passing a predetermined wavelength of light.

14. A method of manufacturing a micro-element package, the method comprising:
    providing a substrate comprising a plurality of micro-elements on a top surface of the substrate and a transparent cover having a plurality of grooves on a bottom surface of the transparent cover, the plurality of the grooves being formed between the plurality of micro-elements;
    forming a sealing pattern on at least one of facing surfaces of the transparent cover and the substrate;
    bonding the substrate and the transparent cover hermetically using the sealing pattern to form a sealed air cavity;
    thinning the transparent cover by eliminating an upper portion of the transparent cover to expose the plurality of grooves; and
    dicing the substrate to provide individual package modules, each comprising a portion of the plurality of micro-elements.

15. The method of claim 14, comprising forming an electrode electrically connected to the plurality of micro-elements on the substrate to be placed below the plurality of grooves.

16. The method of claim 15, wherein the electrode comprises a metal pad.

17. The method of claim 14, the forming the sealing pattern comprising:
    forming a first sealing pattern on a bottom surface of the transparent cover; and
    forming a second sealing pattern corresponding to the first sealing pattern on a top surface of the substrate.

18. The method of claim 14, wherein at least one the first and second sealing patterns comprise an epoxy resin.

19. The method of claim 15, further comprising forming a solder ball or a metal bump on a surface of the electrode before the dicing the substrate.

20. The method of claim 19, wherein the solder ball or the metal bump is formed either before or after the thinning the transparent cover.

21. The method of claim 14, further comprising thinning the bottom surface of the substrate before forming the plurality of grooves.

22. The method of claim 14, wherein the plurality of micro-elements comprise at least one of a micromechanical engineering element, a microelectronic element, and an opto-electronic element.

23. The method of claim 14, wherein the substrate comprises a wafer made of at least one of silicon, lithium-niobate (LiNbO3), lithium tantalite (LiTaO3), and quartz.

* * * * *